United States Patent [19]

Fukasawa et al.

[11] Patent Number: 4,779,225
[45] Date of Patent: Oct. 18, 1988

[54] ADAPTIVE DIGITAL FILTER

[75] Inventors: Atsushi Fukasawa; Kenichiro Hosoda; Ryoichi Miyamoto; Hiromi Ando; Shinji Kawaguchi, all of Tokyo, Japan

[73] Assignee: Oki Electric Industry Co., Ltd., Tokyo, Japan

[21] Appl. No.: 11,050

[22] Filed: Feb. 5, 1987

Related U.S. Application Data

[63] Continuation of Ser. No. 570,634, Jan. 13, 1984, Pat. No. 4,660,163.

[30] Foreign Application Priority Data

| Jan. 17, 1983 | [JP] | Japan | 58-4214 |
| Jan. 17, 1983 | [JP] | Japan | 58-4215 |
| Oct. 6, 1983 | [JP] | Japan | 58-185818 |

[51] Int. Cl.⁴ .......................................... G06F 7/38
[52] U.S. Cl. ........................................ 364/724.19
[58] Field of Search .................. 379/410, 411, 377; 364/724

[56] References Cited

U.S. PATENT DOCUMENTS

| 4,106,102 | 8/1978 | Desblache | 364/724 |
| 4,158,232 | 6/1979 | Koeth et al. | 364/724 |
| 4,393,272 | 7/1983 | Itakura et al. | 364/724 |
| 4,435,823 | 3/1984 | Davis et al. | 364/724 |
| 4,475,211 | 10/1984 | Mattis, Jr. et al. | 364/724 |
| 4,520,941 | 7/1985 | Raulin et al. | 375/27 |
| 4,540,855 | 9/1985 | Szlam et al. | 379/377 |
| 4,567,599 | 1/1986 | Mizoguchi | 375/14 |
| 4,613,731 | 9/1986 | Godard | 379/410 |
| 4,654,808 | 3/1987 | Potter et al. | 364/553 |
| 4,677,668 | 6/1987 | Ardalan et al. | 379/411 |

Primary Examiner—Gary V. Harkcom
Assistant Examiner—Dale M. Shaw
Attorney, Agent, or Firm—Ratner & Prestia

[57] ABSTRACT

An adaptive digital filter which is used, for instance, for a prediction filter in an ADPCM modulator and an ADPCM demodulator, for providing stable operation and minimum phase shift response. The filter (FIG. 4, FIG. 5) has three parallel branches (A,B,C), two (A,B) of them have a plurality of series connected non-recursive filter elements ($A_1$-$A_n$, $B_1$-$B_n$) each of which has degree not larger than three relating to an operator ($Z^{-1}$), and third branch (C) is merely a conductive line. Tap coefficients ($c_1, c_2, \ldots, d_1, d_2, \ldots$) of non-recursive filter elements change according to solutions of the transfer of the filter. A numerator and/or a denominator of the transfer function of the present filter is a Chebychev polynominal relating to an operator ($Z^{-1}$), and has a zero point and/or a pole. The solutions ($w_i, v_i$) of a numerator and a denominator locate alternately on a unit circle (FIG. 6) on a $Z^{-1}$ plane. When solutions of the transfer function do not locate alternately on said unit circle, tap coefficients ($c_1, c_2, \ldots, d_1, d_2, \ldots$) are not updated, since non-alternate solutions do not assure stable operation and/or minimum phase shift response of the filter.

1 Claim, 11 Drawing Sheets

ADAPTIVE DIGITAL FILTER

This application is a continuation of application Ser. No. 570,634, filed Jan. 13, 1984, now U.S. Pat. No. 4,660,163.

BACKGROUND OF THE INVENTION

The present invention relates to an improved iterative controlled adaptive digital filter which is stable in operation and has improved phase response characteristics. The present filter is used for instance as a predictive filter in an adaptive PCM (ADPCM) modulator and/or demodulator. According to the present invention, only the relative location of a pair of solutions of a transfer function on a unit circle on a $Z^{-1}$ plane is monitored, while a prior art monitors the values themselves of the solutions (zero, and pole) of denominator and numerator of transfer function of a non-recursive digital filter which has a feedback loop.

Figure 1:
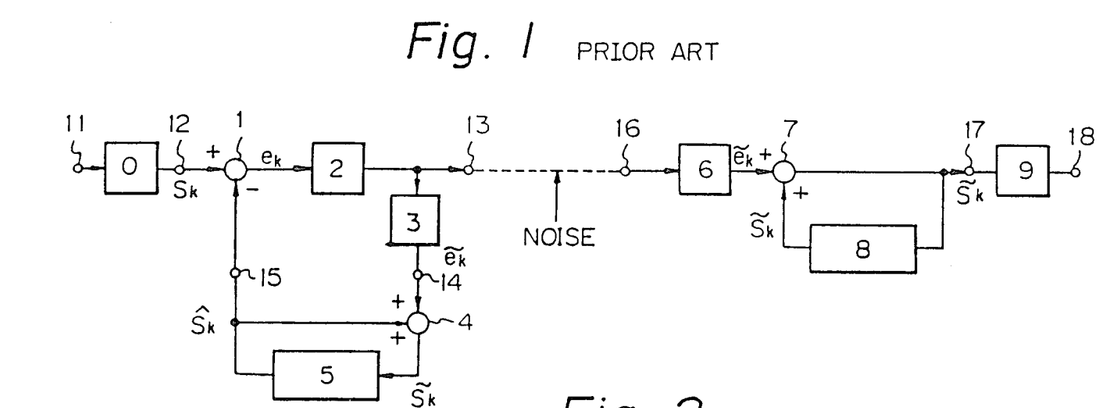
FIG. 1 is a prior ADPCM system.

FIG. 1 shows a block diagram of an ADPCM system which is one of the applicatoins of the present invention. In FIG. 1, the numeral 0 is an A/D converter to convert an analog signal (for instance, voice signal or picture signal) at the input terminal 11 to a digital form, 1, 4 and 7 are adders, 2 is a quantizer for converting an input digital signal to a PCM code, 3 and 6 are inverse-quantizers which demodulates a PCM signal, 5 and 8 are filters, 9 is a D/A converter for converting a digital signal to an analog form, and 11 through 18 are terminals. An analog signal at the input terminal 11 is converted to a digital form by the A/D converter 0. A digital signal $\hat{s}_k$ (k shows time) is applied to the adder 1 which adds the expected signal $\hat{s}_k$ to the input signal $s_k$ and provides the sum which is the error signal $\bar{e}_k$. The error signal $\bar{e}_k$ is quantized by the quantizer 2 and is transmitted to an external circuit through the output terminal 13. The signal at the terminal 13 is reproduced to an error signal $\bar{e}_k$ by the inverse-quantizer 3 and is applied to the adder 4 which adds said predicted value $\hat{s}_k$ and the sum is the reproduced value $\bar{s}_k$.

Similarly, the signal at the output terminal 13 is transmitted to a reception side or a demodulation side. A noise might be added to the signal during the signal is transmitted to the reception side. In a reception side, the reception signal at the input terminal 16 is reproduced to the reproduce signal $s_k$ by the inverse-quantizer 6, the adder 7 and the filter 8. Further, the output signal at the terminal 17 is converted to an analog form by the D/A converter 9.

Figure 2:
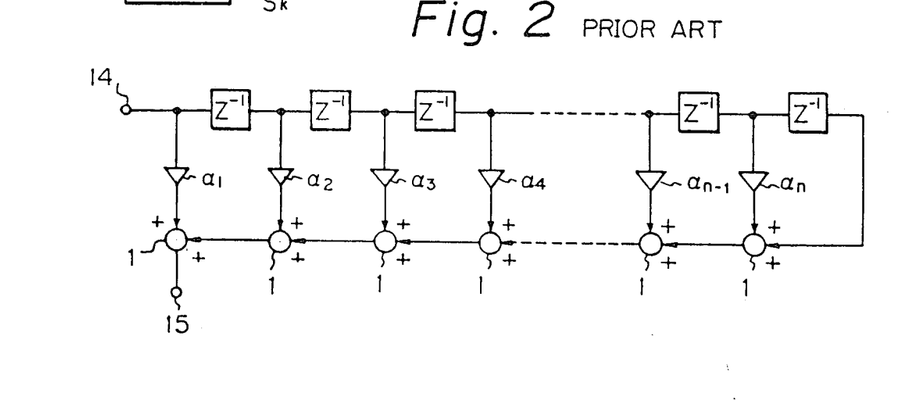
FIG. 2 is a block diagram of a prior adaptive filter.

FIG. 2 is a block diagram of a prior non-recursive digital filter for the filters 5 and 8 in FIG. 1. In FIG. 2, the symbol $Z^{-l}$ is a delay circuit which provides the delay time T which is equal to the sampling period of the digital signal. The symbols $\alpha_1$ through $\alpha_n$ are tap coefficients, and the value of them are iteratively adjusted according to an input signal so that the error signal $e_k$ becomes minimum.

It has been known that an all pole type filter is preferable for a speech signal. On the other hand, a filter which has not only a pole but also a zero point is preferable for multi-level digital signal which has quick change in both amplitude and phase.

However, a filter with both a pole and a zero point has not been used because that kind of filter is apt to oscillate and be affected by noise.

Figure 3:
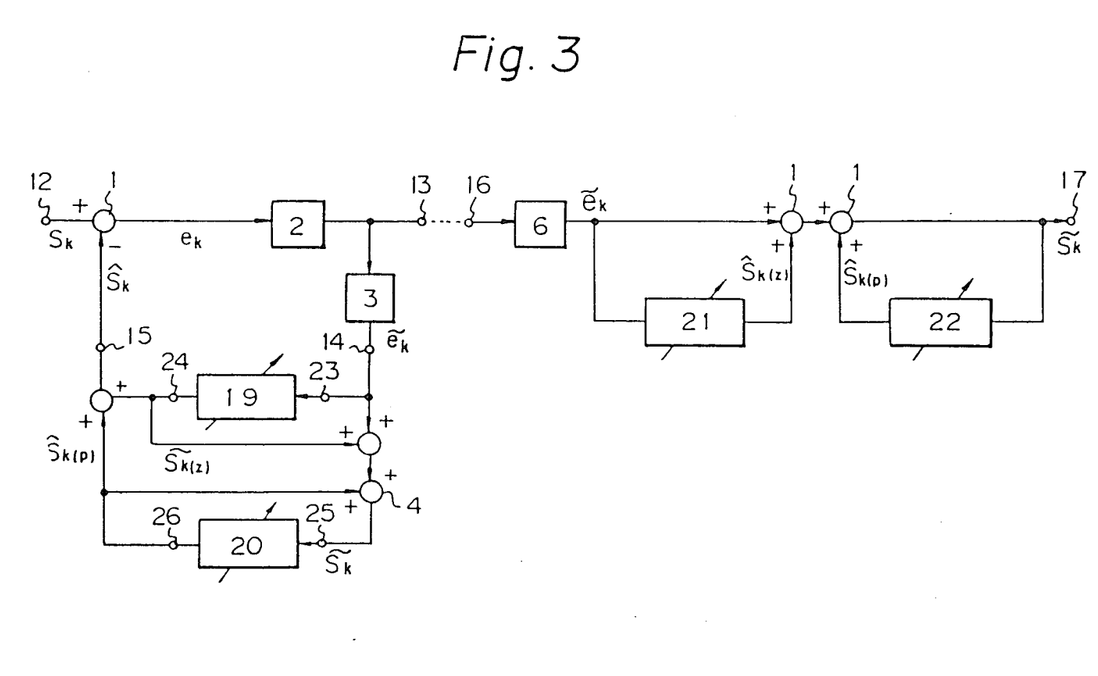
FIG. 3 is an ADPCM system which the present invention is utilized.

FIG. 3 shows a block diagram of an ADPCM system which includes both a pole and a zero point. In the figure, the numerals 19, 20, 21 and 22 are filters, 23 through 26 are terminals. Other symbols in FIG. 3 are the same as those of FIG. 1. The filters 19 through 22 are non-recursive filters with the structure of FIG. 2.

The transfer function $H(Z^{-1})$ of the transmission side of FIG. 3 has the following form.

$$H(Z^{-1}) = ((1 - H_p(Z^{-1}))/(1 + H_z(Z^{-1})) = h_p(Z^{-1})/h_z(Z^{-1}) \quad (1)$$

The transfer function of the reception side is the inverse number of the equation (1). In FIG. 3, the transfer function of the filter between the terminals 12 and 13 is provided a zero point by the non-recursive filter 19, and a pole by the non-recursive filter 20. Therefore, the filter 19 is called a zero filter, and the filter 20 is called a pole filter. The reception side has a zero filter 21, and a pole filter 22.

Conventionally, it has been known that a prior filter of FIG. 2 is not stable in operation. Further, in a prior art, the response of the system is not stable for an input signal which has unexpected statistical nature, and/or noise, and further, the filter is apt to oscillate and/or the reproduced code has much code error.

In order to solve the above problem, one solution is to use a fixed filters 20 and 22 (only filters 19 and 21 are adaptive filters), and the other prior solution is to delete the filters 20 and 22, and that the filters 19 and 21 have the series connection of a plurality of dual quadratic element filters each of which has a pair of tap coefficients in a stable area. However, the former solution has the disadvantage that the adaptive capability and/or the redundancy compression capability is reduced. The latter solution has the advantage that the stable condition of the filter is satisfied, but, no mathematical algorithm for determining mutual relations between tap coefficients and solutions (pole and zero point) of each element filter. If the filters are adjusted so that an error signal becomes minimum, the convergence of solutions becomes slow and effect of a zero point becomes vague.

SUMMARY OF THE INVENTION

It is an object of the present invention to overcome the disadvantages and limitations of a prior adaptive filter by providing a new and improved adaptive filter.

It is also an object of the present invention to provide an adaptive filter which has both a pole and a zero point, stable in operation, and has excellent phase response.

The above and other objects are attained by an adaptive digital filter with a transfer function which includes at least one of a pole and a zero point in a denominator and a numerator in a transfer function which changes successively or at least in every predetermined period, comprising; at least one of denominator and numerator of a transfer function being a Chebyshev polynominal relating to an operator $Z^{-1}$; said filter having three substantially parallel branches (A, B, C); first branch (A) and second branch (B) having a plurality of series connected non-recursive filter elements which have degree not larger than three relating to an operator $Z^{-1}$; third branch (C) being a merely conductive line; and means for determining tap coefficients of said non-recursive filter elements according to solutions of said transfer function.

Preferably, solutions of a numerator, and solutions of a denominator of the transfer function locate alternately on a unit circle on a $Z^{-1}$ plane to assure stable operation and/or minimum phase shift response of the filter.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 4:
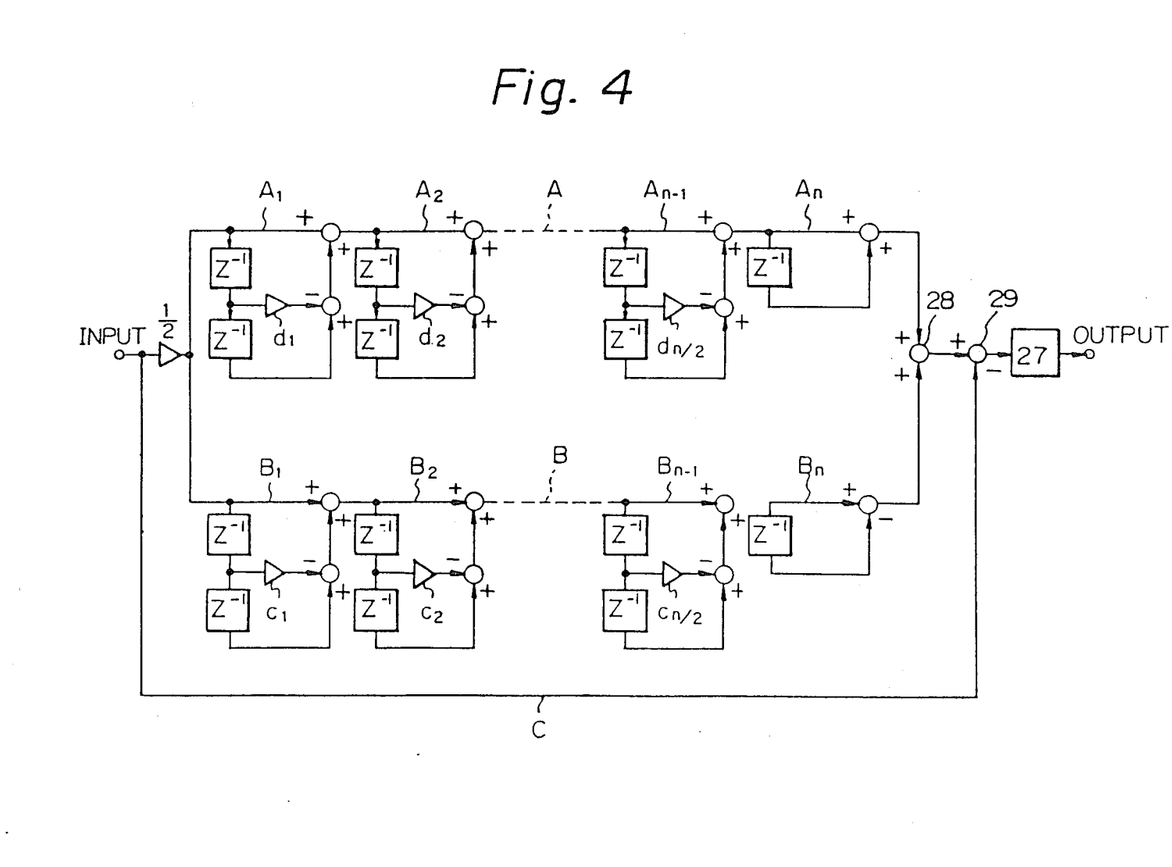
FIG. 4 is a block diagram of the adaptive filter according to the present invention when the value (n) is odd number.

FIG. 4 shows a block diagram of the adaptive filter according to the present invention. FIG. 4 is the detailed block diagram of the filter 19, 20, 21 or 22 in FIG. 3, and is used by inserting the same in the block 19, 20, 21 or 22 in FIG. 3. The present filter has three substantially parallel branches A, B and C. The former two branches A and B have a series circuit which has a plurality of non-recursive filters each of which has the degree equal to or less than 2 relating to the operator $Z^{-1}$. The third branch C is just a direct line. The adder 28 is provided to add the outputs of the branches A and B, and another adder 29 is provided to add the output of the adder 28 and the third branch C. The attenuator 30 for multiplying $\frac{1}{2}$ to the input signal is provided between the input terminal and the branches A and B. The numeral 27 is another attenuator for providing the multiplication by the value which is 1 or less than 1 but close to 1, to the input signal. The structure of the filters 19 through 22 are completely identical, except that a degree of each element filter, and the solution (pole or zero point) of the filter depending upon the tap coefficients are differenct from those of other filters.

When the filter is a zero filter, each tap coefficient is given below, where n is a degree of an element filter.

$c_{1z}, c_{2z}, \ldots, c_{nz/2}$ $d_{1z}, d_{2z}, \ldots, d_{nz/2}$

When the filter is a pole filter, each tap coefficient is shown below, where m is a degree of an element filter.

$c_{1p}, c_{2p}, \ldots, c_{mp/2}$ $d_{1p}, d_{2p}, \ldots, d_{mp/2}$

Further, it is assumed that each tap coefficient is different from other tap coefficients.

The transfer function $h(Z^{-1})$ of the present filter is given by the following equations.

When n is an odd number;

$$h(Z^{-1}) = H(Z^{-1}) - 1 = \tfrac{1}{2}[U_2(Z^{-1}) + U_1(Z^{-1})] - 1 \qquad (2)$$
$$= \tfrac{1}{2}\left[ (Z^{-1} + 1) \prod_{i=1}^{(n-1)/2} (Z^{-2} - 2d_i Z^{-1} + 1) - (Z^{-1} - 1) \prod_{i=1}^{(n-1)/2} (Z^{-2} - 2c_i Z^{-1} + 1) \right] - 1$$

Figure 5:
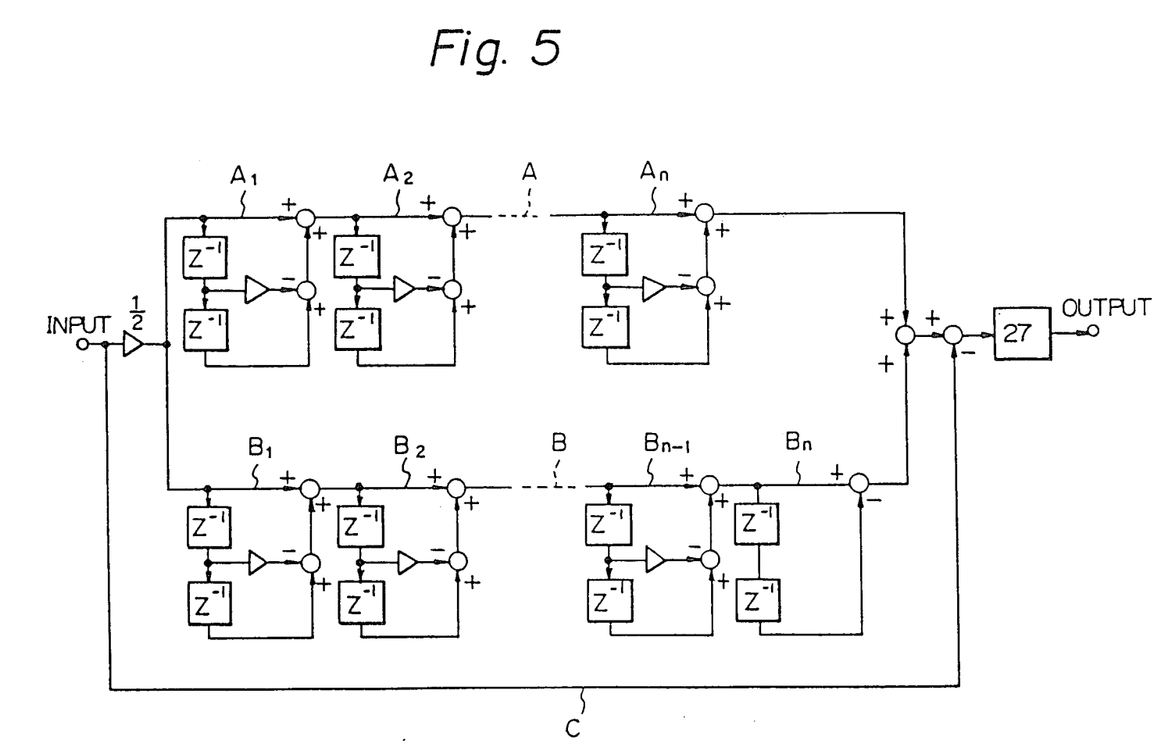
FIG. 5 is a block diagram of the adaptive filter according to the present invention when the value (n) is even number.

When n is an even number;

$$h(Z^{-1}) = H(Z^{-1}) - 1 = \tfrac{1}{2}[U_2(Z^{-1}) + U_1(Z^{-1})] - 1 \qquad (3)$$
$$= \tfrac{1}{2}\left[ \prod_{i=1}^{n/2-1} (Z^{-2} - 2d_i Z^{-1} + 1) - (Z^{-2} - 1) \prod_{i=1}^{n/2-1} (Z^{-2} - 2c_i Z^{01} + 1) \right] - 1$$

FIG. 4 shows the case when n is an odd number, and the case when n is an even number (equation 3) is shown in FIG. 5.

It is assumed for the sake of the simplicity of the explanation that n is an even number, a filter is a zero filter in the following description.

Figure 6:
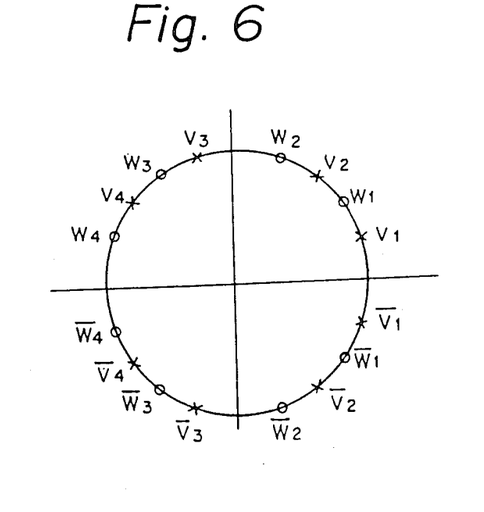
FIG. 6 is a graph showing the location of solutions of a transfer function on a $Z^{-1}$ plane.

FIG. 6 shows the location of the solutions on a $Z^{-1}$ plane when n=8. All the solutions are imaginary number, which is positioned on a unit circle ($|Z^{-1}|=1$). The symbols $w_i$ is the solution of a denominator (or a numerator) of a transfer function, and $v_i$ is the solution of the numerator (or denominator) of a transfer function. It should be noted in FIG. 6 that a set of solutions $w_i$ and another set of solutions $v_i$ are located alternately, that is to say, each solution in a first group ($w_i$) separates a pair of adjacent solutions of another group ($v_i$). Apparently, the sequence of the solutions in FIG. 6 is $w_1$, $v_1$, $w_2$, $v_2$, $w_3$, $v_3$, , , and therefore, $w_i$ and $v_i$ appear alternately.

The tap coefficients $c_i$, and $d_i$ is shown below.

$c_i = e^{jw_i} = \cos w_i$ $d_i = e^{jv_i} = \cos v_i \qquad (4)$ where $w_i$ and $v_i$ are angular frequency (radian) of a solution on a unit circle on a $Z^{-1}$ plane.

The relations between coefficients of a transversal filter in FIG. 2, and coefficients of the present adaptive filter (FIG. 4) are shown below, where the transfer function of the transversal filter in FIG. 2 is;

$$H(Z) = \sum_{i=1}^{M} a_i z^{-1} \quad (5)$$

(1) When $M = 2$;

$$\alpha_1 = -\tfrac{1}{2}(c_1 + d_1) \quad (6)$$

$$\alpha_2 = \tfrac{1}{2}(2 + c_1 - d_1) \quad (7)$$

(2) When $M = 4$;

$$\alpha_1 = -\tfrac{1}{4}(c_1 + c_2 + d_1 + d_2) \quad (8)$$

$$\alpha_2 = \tfrac{1}{4}[4 + c_1 + c_2 + c_1c_2 - (d_1 + d_2 - d_1d_2)] \quad (9)$$

$$\alpha_3 = -\tfrac{1}{4}[c_1 + c_2 + c_1c_2 + d_1 + d_2 - d_1d_2] \quad (10)$$

$$\alpha_4 = \tfrac{1}{4}[2 + c_1 + c_2 - (d_1 + d_2)] \quad (11)$$

(3) When $M = 6$;

$$\alpha_1 = -\tfrac{1}{6}(c_1 + c_2 + c_3 + d_1 + d_2 + d_3) \quad (12)$$

$$\alpha_2 = \tfrac{1}{6}[6 + c_1 + c_2 + c_3 + c_1c_2 + c_1c_3 + c_2c_3 - \\ (d_1 + d_2 + d_3) + d_1d_2 + d_1d_3 + d_2d_3] \quad (13)$$

$$\alpha_3 = -\tfrac{1}{6}[2(c_1 + c_2 + c_3) + c_1c_2 + c_1c_3 + c_2c_3 + c_1c_2c_3 + \\ 2(d_1 + d_2 + d_3) - (d_1d_2 + d_1d_3 + d_2d_3) + d_1d_2d_3] \quad (14)$$

$$\alpha_4 = \tfrac{1}{6}[6 + 2(c_1 + c_2 + c_3) + c_1c_2 + c_1c_3 + c_2c_3 + \\ c_1c_2c_3 - 2(d_1 + d_2 + d_3) + d_1d_3 + d_1d_3 + d_2d_3 - d_1d_2d_3] \quad (15)$$

$$\alpha_5 = -\tfrac{1}{6}[c_1 + c_2 + c_3 + c_1c_3 + c_1c_2 + c_2c_3 + \\ d_1 + d_2 + d_3 - (d_1d_2 + d_1d_3 + d_2d_3)] \quad (16)$$

$$\alpha_6 = \tfrac{1}{6}[2 + c_1 + c_2 + c_3 - (d_1 + d_2 + d_3)] \quad (17)$$

(4) When $M = 8$;

$$\alpha_1 = -\tfrac{1}{8}[c_1 + c_2 + c_3 + c_4 + d_1 + d_2 + d_3 + d_4] \quad (18)$$

$$\alpha_2 = \tfrac{1}{8}[c_1 + c_2 + c_3 + c_4 + c_1c_2 + c_1c_3 + c_1c_4 + c_2c_4 + \\ c_3c_4 - (d_1 + d_2 + d_3 + d_4) + d_1d_2 + d_1d_3 + d_1d_4 + \\ d_2d_3 + d_2d_4 + d_3d_4 + 8] \quad (19)$$

$$\alpha_3 = -\tfrac{1}{8}[3(c_1 + c_2 + c_3 + c_4) + c_1c_2 + c_1c_3 + c_1c_4 + \\ c_2c_3 + c_2c_4 + c_3c_4 + c_1c_2c_3 + c_1c_2c_4 + c_1c_3c_4 + \\ c_2c_3c_4 + 3(d_1 + d_2 + d_3 + d_4) - (d_1d_2 + d_1d_3 + d_1d_4 + \\ d_2d_3 + d_2d_4 + d_2d_3) + d_1d_2d_3 + d_1d_2d_4 + d_1d_3d_4 + d_2d_3d_4 + 6] \quad (20)$$

$$\alpha_4 = \tfrac{1}{8}[3(c_1 + c_2 + c_3 + c_4) + 2(c_1c_2 + c_1c_3 + c_1c_4 + \\ c_2c_3 + c_2c_4 + c_3c_4) + c_1c_2c_3 + c_1c_2c_4 + c_1c_3c_4 + c_2c_3c_4 + \\ c_1c_2c_3c_4 - 3(d_1 + d_2 + d_3 + d_4) + 2(d_1d_2 + d_1d_3 + d_1d_4 + \\ d_2d_3 + d_2d_4 + d_3d_4) - (d_1d_2d_3 + d_1d_2d_4 + d_1d_3d_4 + d_2d_3d_4) + \\ d_1d_2d_3d_4 + 12] \quad (21)$$

$$\alpha_5 = -\tfrac{1}{8}[3(c_1 + c_2 + c_3 + c_4) + 2(c_1c_2 + c_1c_3 + c_1c_4 + \\ c_2c_3 + c_2c_4 + c_3c_4) + c_1c_2c_3 + c_1c_2c_4 + c_1c_3c_4 + c_2c_3c_4 + \\ c_1c_2c_3c_4 + 3(d_1 + d_2 + d_3 + d_4)12 (d_1d_2 + d_1d_3 + d_1d_4 + \\ d_2d_3 + d_2d_4 + d_3d_4) + d_1d_2d_3 + d_1d_2d_4 + d_1d_3d_4 + d_2d_3d_4 - \quad (22)$$

$$d_1d_2d_3d_4 + 6]$$

$$\alpha_6 = \tfrac{1}{8}[3(c_1 + c_2 + c_3 + c_4) + c_1c_2 + c_1c_3 + c_1c_4 + \\ c_2c_3 + c_2c_4 + c_3c_4 + c_1c_2c_3 + c_1c_2c_4 + c_1c_3c_4 + c_2c_3c_4 - \\ 3(d_1 + d_2 + d_3 + d_4) + d_1d_2 + d_1d_3 + d_1d_4 + d_2d_3 + d_2d_4 + \\ d_3d_4 - (d_1d_2d_3 + d_1d_2d_4 + d_1d_3d_4 + d_2d_3d_4) + 8] \quad (23)$$

$$\alpha_7 = -\tfrac{1}{8}[c_1 + c_2 + c_3 + c_4 + c_1c_2 + c_1c_3 + c_1c_4 + c_2c_3 + \\ c_2c_4 + c_3c_4 - (d_1 + d_2 + d_3 + d_4 + d_1d_2 + d_1d_3 + d_1d_4 + \\ d_2d_3 + d_2d_4 + d_3d_4)] \quad (24)$$

$$\alpha_8 = \tfrac{1}{8}(c_1 + c_2 + c_3 + c_4 - d_1 - d_2 - d_3 - d_4 + 2) \quad (25)$$

Although the prior filter of FIG. 2 is impossible to monitor the stability of the solutions, the present filter has the advantages as follows since the solutions locate on a unit circle of a $Z^{-1}$ plane and each solution of a first group separates a pair of adjacent solutions in another group, and the coefficients of the filter can be determined by said equation (4).

(a) The stable operation of a pole filter with any degree is always expected.

(b) The necessary accuray of the calculation for the update of a solution and/or a tap coefficient can be reduced as compared with that of a prior art. In a prior art of FIG. 2, the amplitude and the phase of the solutions are directly calculated, and the fact that the solution locates outside of the circle of FIG. 6 is acknowledged. On the other hand, in the present invention, the amplitude of all the solutions is 1, and therefore, it is enough to check only a phase of the solutions.

(c) When a solution of a zero filter is simultaneously checked so that said solution is controlled to separate another group of solutions, both the poles and the zero points of the transfer function locates in the left half plane of the S-area (S is a Laplace operator), and therefore, the minimum phase shift response of the circuit is expected.

The successive (iterative) update of the coefficients are accomplished by for instance correlation calculation, an inverse filtering, et al. The transfer function H(Z) of the present seccessive adaptive filter may be all-pole type, all-zero type, or pole-zero type.

Figure 7:
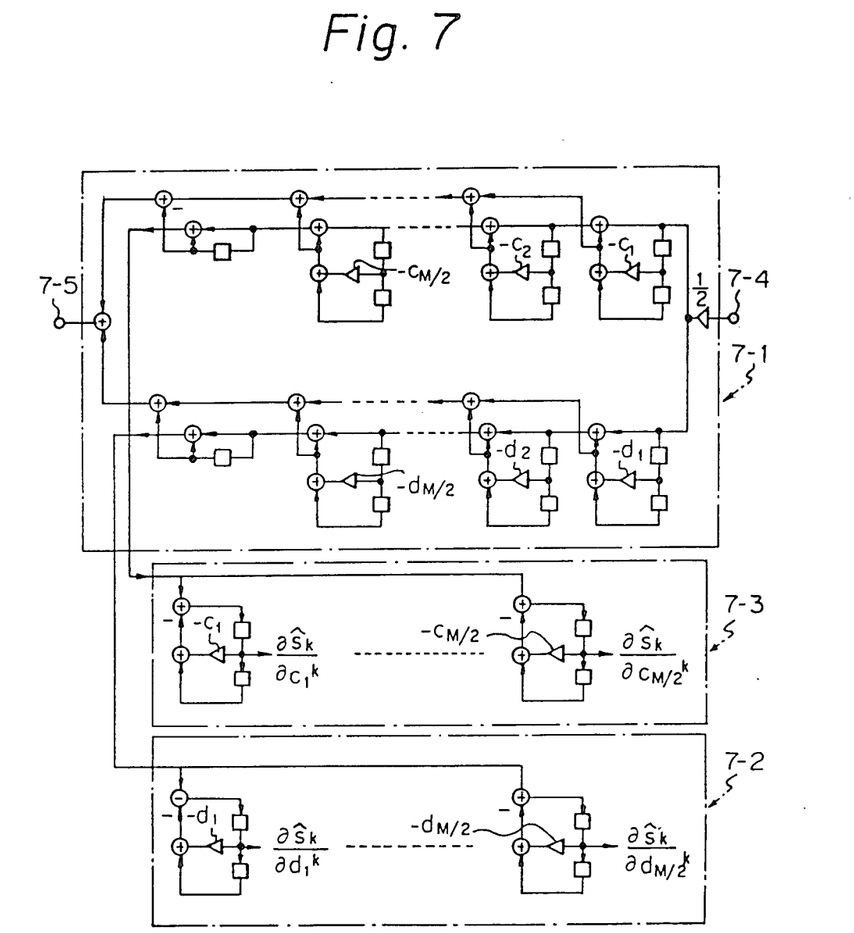
FIG. 7 is a block diagram of another embodiment of the present adaptive filter when the number (n) is even number.

FIG. 7 shows the second embodiment of the present adaptive filter, when the degree of the filter is an even number. In the figure, the numeral 7-1 is an adaptive filter, 7-2 is an inverse filter for generating gradient vector component of a filter coefficient $d_i$ ($i=1$—$M/2$), and 7-3 is an inverse filter for generating a gradient vector component of a filter coefficient $c_i$ ($i=1$—$M/2$). The adaptive filter portion 7-1 in FIG. 7 has at least one branch which has at least one sampling period of delay $Z^{-1}$ between the input 7-4 and the output 7-5, instead of a direct line C of FIG. 4. The effect of 7-1 of FIG. 7 is the same as that of FIG. 4. Each box in FIG. 7 shows $Z^{-1}$.

According to the algorithm of a gradient method, a filter coefficient of an adaptive filter at time k+1 is updated by the following equations.

$$c_i^{k+1} = c_i^k + \Delta e_k(\delta \hat{s}_k / \delta c_i^k) \quad (i=1\text{—}M/2) \quad (26)$$

$$d_i^{k+1} = d_i^k + \Delta i_k(\delta \hat{s}_k \delta c_i^k) \quad (i=1\text{—}M/2) \quad (27)$$

The gradient vector component of the equations (26) and (27) are shown in the following equations, where E(z) is a z conversion of the difference signal $e_n$.

$$\delta \hat{s}_k/\delta c_i^k = -1/2\pi j \phi z^{k-1} E(z) U_1(z)(z^{-2} - c_i^k z^{-1} + 1)^{-1} z^{-1} dz \quad (28)$$

$$\delta \hat{s}_k/\delta d_i^k = -1/2\pi j \phi z^{k-1} E(z) U_2(z)(z^{-2} - d_i^k z^{-1} + 1)^{-1} z^{-1} dz \quad (29)$$

The following equations are useful for smplifying a hardware structure, instead of the above two equations.

$$c_i^{k+1} = c_i^k + \Delta \cdot sgn(e_k) \cdot sgn(\delta \hat{s}_k/\delta c_i^k) \quad (30)$$

$$d_i^{k+1} = d_i^k + \Delta \cdot sgn(e_k) \cdot sgn(\delta \hat{s}_k/\delta d_i^k) \quad (31)$$

As described above, according to the second embodiment, the gradient vector component of successive updated coefficients according to the gradient method algorithm is obtained by an inverse filter. Therefore, the calculation is simple, and the stability of the updated solutions can be checked merely by the separation check (alternate location check) of the solutions. The embodiment is applicable to a pole-zero type transfer function, pole type filter, zero type filter.

As a modification of the second embodiment, the gradient vector component of a filter coefficient is obtained by correlation calculation, instead of using an inverse filter.

Figure 8:
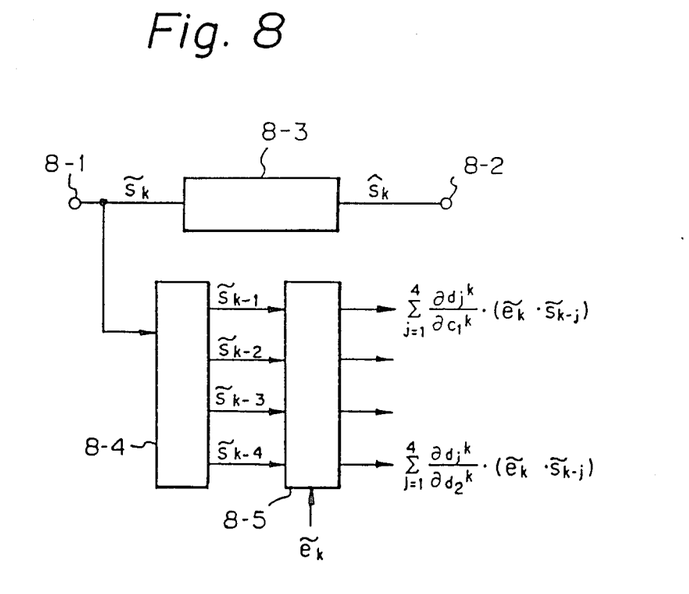
FIG. 8 is a block diagram of still another embodiment of the present invention when the value M is 4.

FIG. 8 is the third embodiment, in which the degree of the filter is M=4. In the figure, the numerals 8-1 and 8-2 are input and output terminals, respectively, 8-3 is an adaptive filter described in the previous first or second embodiment, 8-4 is an output buffer of an output of the adaptive filter 8-3, and 8-5 is a calculation circuit for the calculation of the gradient vector component of a filter coefficient.

The gradient vector component in the equations (26) and (27) is obtained by the equations (5), and (8) through (11) as follows.

$$\partial \hat{S}_k / \partial C_i^k = \sum_{j=1}^{M} \frac{\partial \alpha_j^k}{\partial C_i^k} \tilde{S}_{k-j} \ (i = 1 \ldots M/2) \quad (32)$$

$$\partial \hat{S}_k / \partial d_i^k = \sum_{j=1}^{M} \frac{\partial \alpha_j^k}{\partial d_i^k} \tilde{S}_{k-j} \ (i = 1 \ldots M/2) \quad (33)$$

Accordingly;

$$\sum_{j=1}^{4} \frac{\partial \alpha_j^k}{\partial C_1} (\overline{e_k s}_{-j}) = \quad (34)$$

$$\frac{1}{2}[\overline{e_k s}_{k-j} - (1 + c_2)\overline{e_k s}_{k-2} + (1 + c_2)\overline{e_k s}_{k-3} - \overline{e_k s}_{k-4}]$$

$$\sum_{j=1}^{4} \frac{\partial \alpha_j^k}{\partial C_2} (\overline{e_k s}_{-j}) = \quad (35)$$

$$\frac{1}{2}[\overline{e_k s}_{k-1} - (1 + c_1)\overline{e_k s}_{k-2} + (1 + c_2)\overline{e_k s}_{k-3} - \overline{e_k s}_{k-4}]$$

$$\sum_{j=1}^{4} \frac{\partial \alpha_j^k}{\partial \alpha_1} (\overline{e_k s}_{-j}) = \quad (36)$$

$$\frac{1}{2}[\overline{e_k s}_{k-1} + (1 - d_2)\overline{e_k s}_{k-2} + (1 - d_2)\overline{e_k s}_{k-3} + \overline{e_k s}_{k-4}]$$

$$\sum_{j=1}^{4} \frac{\partial \alpha_j^k}{\partial d_2} (\overline{e_k s}_{-j}) = \quad (37)$$

$$\frac{1}{2}[\overline{e_k s}_{k-1} + (1 - d_1)\overline{d_k s}_{k-2} + (1 - d_1)\overline{e_k s}_{k-3} + \overline{e_k s}_{k-4}]$$

Figure 9:
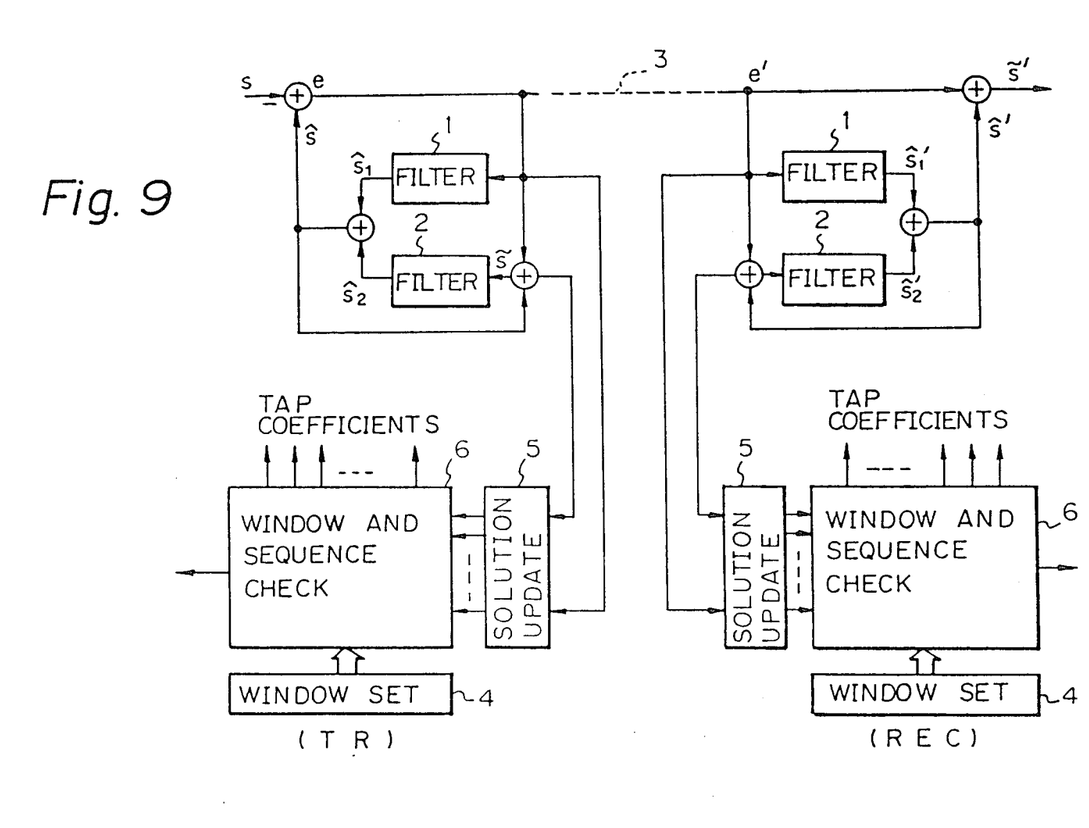
FIG. 9 is a block diagram of still another embodiment of the present invention.

FIG. 9 shows the fourth embodiment of the present invention. In the figure, 1 and 2 are prediction filter, 3 is a line, 4 is a memory, 5 and 6 are calculation elements. The circuit of FIG. 9 provides the prediction signal s from the input signal s. Then, the difference e between the signal s and the prediction signal s is transmitted to the line. Then, the reception side reproduces the reproduction signal s of the original signal s. The signal in the reception side is indicated by ('), which means that the signal is suffered from noise in the transmission line. The symbols in the figure are as follows.

s; input pulse signal,
$s_1$, $\hat{s}_1'$; output of the filter 1
$s_2$, $\hat{s}_2'$; output of the filter 2
e, e'; difference signal,
$\tilde{s}$; output signal pulse of the system, that is to say, the reproduction signal of the signal s.
$H_0$; transfer function of the reception side. input e', output $s_0'$
$c_i^{(2)}$, $d_i^{(2)}$; tap coefficients (FIG. 9) of the prediction filter 2.

While the second and the third embodiments control directly the tap coefficients of an adaptive predictive filter, the fourth embodiment controlls the angular frequency $w_i$ and $v_i$ in the equation (4).

A pair of solutions $w_i^{(1)}$ and $v_i^{(1)}$ of the prediction filter 1 in FIG. 9 (i=1—m/2) are controlled according to the next equation, where k is a discrete time.

$$w_{i,k+1}^{(1)} = w_{i,k}^{(1)} + g_k^{(1)} \tilde{e}_k \sin w_{i,k}^{(1)} \sum_{j=1}^{m} A_{i,j}^{(1)} \tilde{e}_{k-1} \\ v_{i,k+1}^{(1)} = v_{i,k}^{(1)} + g_k^{(1)} \tilde{e}_k \sin v_{i,k}^{(1)} \sum_{j=1}^{m} B_{i,j} \tilde{e}_{k-j} \quad (38)$$

The tap coefficients are shown below.

$$\left. \begin{array}{l} -2c_{i,k+1}^{(1)} = -2 \cos w_{i,k+1}^{(1)} \\ -2d_{i,k+1}^{(1)} = -2 \cos v_{i,k+1}^{(1)} \end{array} \right\} \quad (39)$$

where;

$$i = 1 \ldots m/2, \ g_k^{(1)} = \alpha / \sum_{i=1}^{m} (\tilde{e}_{k-i})^2, \ = \text{constant}, \quad (40)$$

The coefficients $A_{i,j}^{(1)}$ and $B_{i,j}^{(1)}$ when m=6 in the equation (38) are shown below.

$$\left. \begin{array}{l} A_{1,1}^{(1)} = -A_{1,6}^{(1)} = 1 \\ A_{1,2}^{(1)} = -A_{1,5}^{(1)} = -(1 + 2\cos w_2^{(1)} + 2\cos w_3^{(1)}) \\ A_{1,3}^{(1)} = -A_{1,4}^{(1)} = 2(1 + \cos w_2^{(1)} + \cos w_3^{(1)} + \\ 2\cos w_2^{(1)} \cos w_3^{(1)}) \end{array} \right\} \quad (41)$$

-continued $$A^{(1)}_{2,1} = -A^{(1)}_{2,5} = 1$$
$$A^{(1)}_{2,2} = -A^{(1)}_{2,5} = -(1 + 2\cos w^{(1)}_1 + 2\cos w^{(1)}_3)$$
$$A^{(1)}_{2,3} = -A^{(1)}_{2,4} = 2(1 + \cos w^{(1)}_1 + \cos w^{(1)}_3 + 2\cos w^{(1)}_1 \cos w^{(1)}_3)$$
(42)

$$A^{(1)}_{3,1} = -A^{(1)}_{3,5} = 1$$
$$A^{(1)}_{3,2} = -A^{(1)}_{3,5} = -(1 + 2\cos w^{(1)}_1 + 2\cos w^{(1)}_2)$$
$$A^{(1)}_{3,3} = -A^{(1)}_{3,4} = 2(1 + \cos w^{(1)}_1 + \cos w^{(1)}_2 + 2\cos w^{(1)}_1 \cos w^{(1)}_2)$$
(43)

$$B^{(1)}_{1,1} = B^{(1)}_{1,6} = 1$$
$$B^{(1)}_{1,2} = B^{(1)}_{1,5} = 1 - 2\cos v^{(1)}_1 - 2\cos v^{(1)}_3$$
$$B^{(1)}_{1,3} = B^{(1)}_{1,4} = 2(1 - \cos v^{(1)}_2 - \cos v^{(1)}_3 + 2\cos v^{(1)}_2 \cos v^{(1)}_3)$$
(44)

$$B^{(1)}_{2,1} = B^{(1)}_{2,6} = 1$$
$$B^{(1)}_{2,2} = B^{(1)}_{2,5} = 1 - 2\cos v^{(1)}_1 - 2\cos v^{(1)}_3$$
$$B^{(1)}_{2,3} = B^{(1)}_{2,4} = 2(1 - \cos v^{(1)}_2 - \cos v^{(1)}_3 + 2\cos v^{(1)}_2 \cos v^{(1)}_3)$$
(45)

$$B^{(1)}_{3,1} = B^{(1)}_{3,6} = 1$$
$$B^{(1)}_{3,2} = B^{(1)}_{3,5} = 1 - 2\cos v^{(1)}_1 - 2\cos v^{(1)}_2$$
$$B^{(1)}_{3,3} = B^{(1)}_{3,4} = 2(1 - \cos v^{(1)}_1 - \cos v^{(1)}_2 + 2\cos v^{(1)}_1 \cos v^{(1)}_2)$$
(46)

Similarly, a pair of solutions $w_i^{(2)}$, and $v_i^{(2)}$, $i = 1 — n/2$ are defined by the following equations.

$$w^{(2)}_{i,k+1} = w^{(2)}_{i,k} + g^{(2)}_k \bar{e}_k \sin w^{(2)}_{i,k} \sum_{j=1}^{n} A^{(2)}_{i,j} \bar{s}_{k-j}$$
$$v^{(2)}_{i,k+1} = v^{(2)}_{i,k} + g^{(2)}_k \bar{e}_k \sin v^{(2)}_{i,k} \sum_{j=1}^{n} B^{(2)}_{i,j} \bar{s}_{k-j}$$
(47)

The tap coefficients are given below.

$$-2c^{(1)}_{i,k+1} = -2\cos w^{(2)}_{i,k+1}$$
$$-2d^{(2)}_{i,k+1} = -2\cos v^{(2)}_{i,k+1}$$
(48)

where $$i + 1 \ldots n/2, \; g^{(2)}_k = \alpha / \sum_{i=1}^{n} (s_{k-i})^2, \; \alpha = \text{constant}$$
(49)

The constant ($\alpha$) in the equations (40) and (49) are in the range $2^{-7}$ and $2^{-10}$.

The four kinds of solutions $w_i^{(1)}$, $v_i^{(1)}$ (i=1—m/2 (prediction filter 1)), $w_i^{(2)}$, $v_i^{(2)}$ (i=1—n/2 (prediction filter 2)) are obtained iteratively by the calculation of the equations (38) through (49). Those values correspond to the angular frequency (radian) of the zero point ($w_i^{(1)}$, $v_i^{(1)}$), and the pole ($w_i^{(2)}$, $v_i^{(2)}$) of the transfer function $H_0$.

Figure 10:
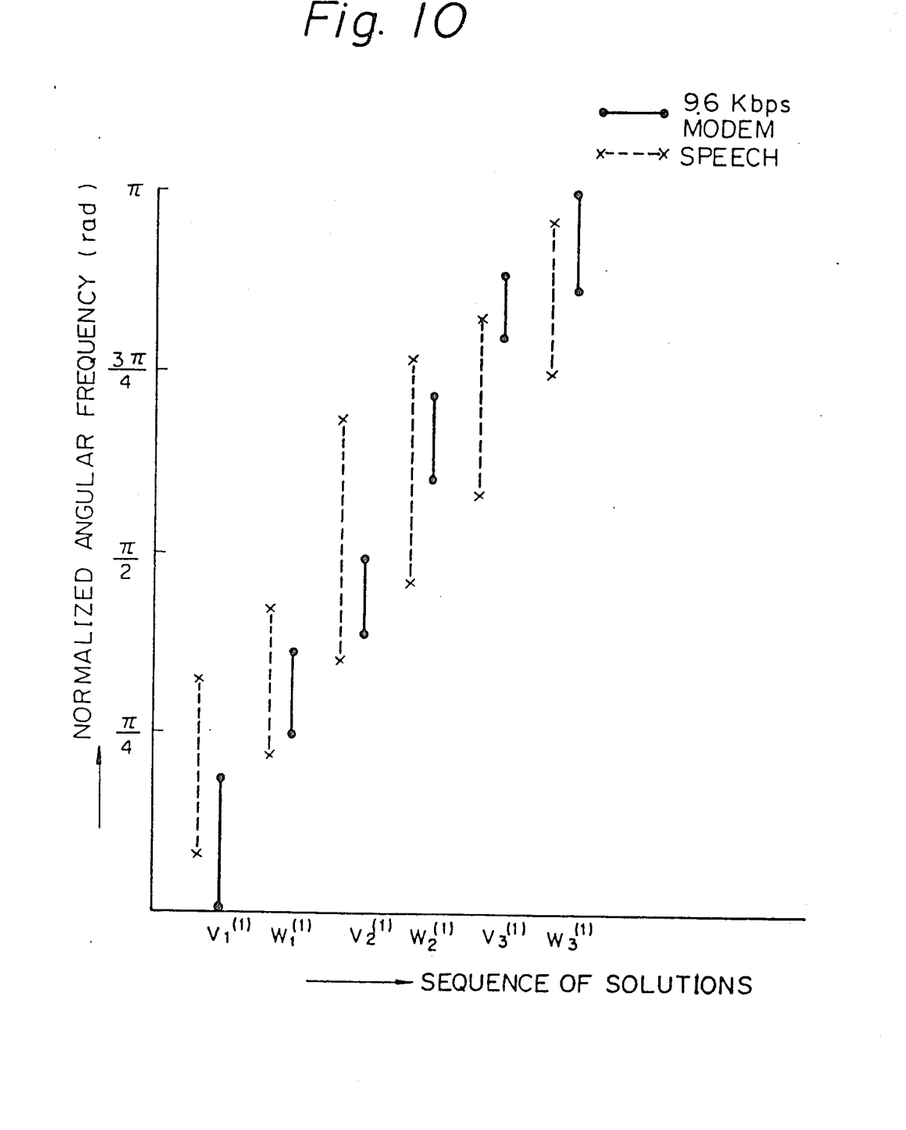
FIG. 10 shows the pattern of the solutions of the transfer function in the embodiment of FIG. 9.

The fourth embodiment is based upon the fact that the result of the iterative change of the four normalized angular frequency is in a predetermined range, and has the particular pattern defined by a kind of a signal. FIG. 10 shows the features of a speech, and a modem signal (9.6 kbps). In case of a speech signal, the range of the solution overlaps with that of adjacent solution. On the other hand, in case of a modum signal, the range of the solutions does not overlap. The memory 4 stores the upper limit value and the lower limit value of the range of the solution as a window set. The updated values of the solutions are calculated by the calculation element 5 (equations (38) and (47)). Next, sequence check of the solutions is accomplished. If those conditions are satisfied, the transfer function $H_0$ (reception), and the inverse transfer function $1/H_0$ (transmission side) are stable and provide a minimum phase shift response.

Next, the check if the solutions are within the window set (window check) is accomplished. When the solutions locates in the window set of a modem signal, the input signal is recognized as a modem signal, and the identification signal ID is output. The sequence check and the window check are accomplished by the calculation element 6, which is enough merely to perform subtraction and recognition of a sign (positive or negative). If the calculation element 6 provides an output signal after a plurality of signal recognitions, a time constant is obtained in a recognition. When no identification output ID is provided, it is recognized that a reception signal is not normal, and perhaps a noise disturbed the signal. In that case, the value of the solution is reset to the previous value or the initial value so that the system does not oscillate. Thus, the unexpected operation by noise is prevented.

As described above, the fourth embodiment transmits a difference of a digital signal, and monitors iteratively the solution of a prediction filter, then, the stable transmission of a signal is obtained, the minimum phase shift response is satisfied, the recognition of a signal is accomplished both in a transmission side and a reception side, and further, the affection by a noise is prevented.

Figure 11:
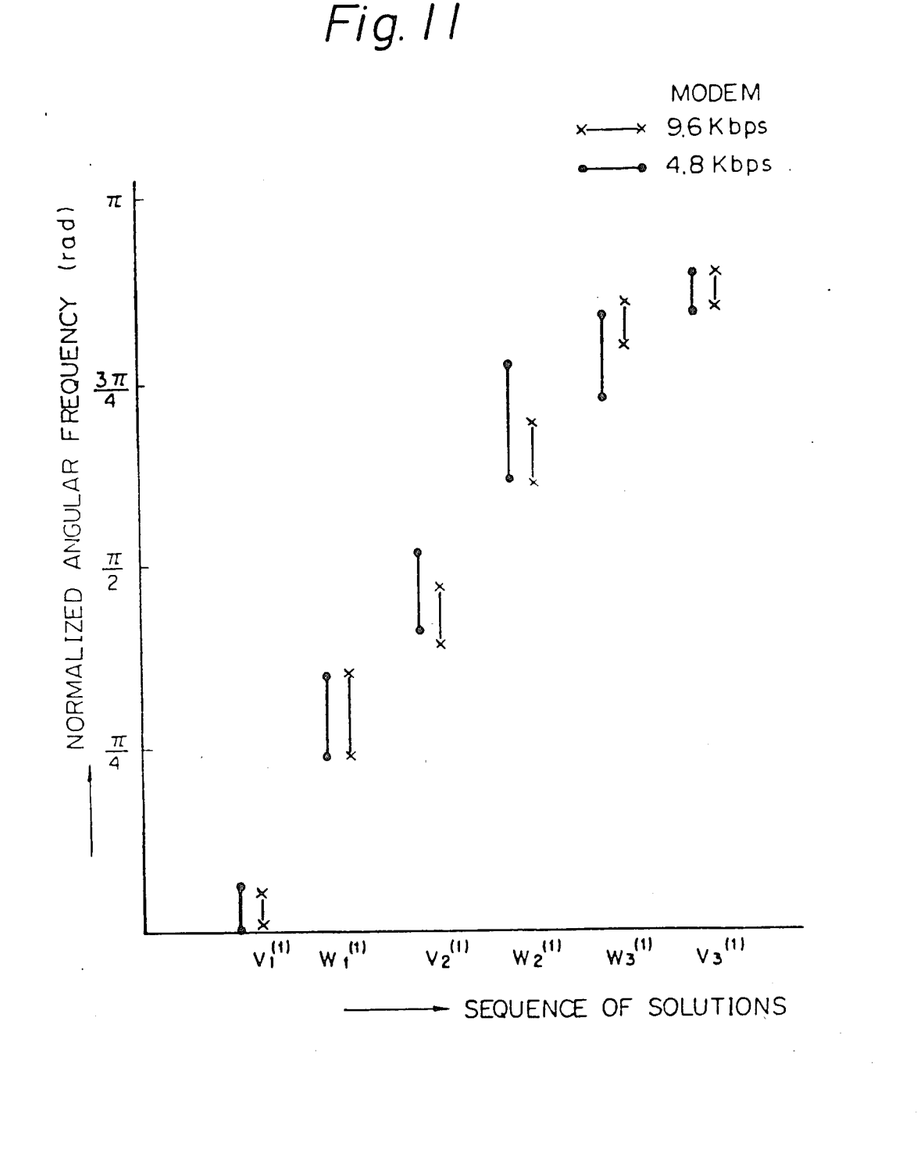
FIG. 11 shows another pattern of the solutions of the transfer function in the embodiment of FIG. 9.

FIG. 11 shows the location of the solutions for a modem signal of 9.6 kbps, and a modem signal of 4.8 kbps. In this case, the range of the solutions is similar to each other.

The embodiments of FIG. 10 and FIG. 11 function to discriminate an input signal from a speech signal and a modem signal.

Figure 12:
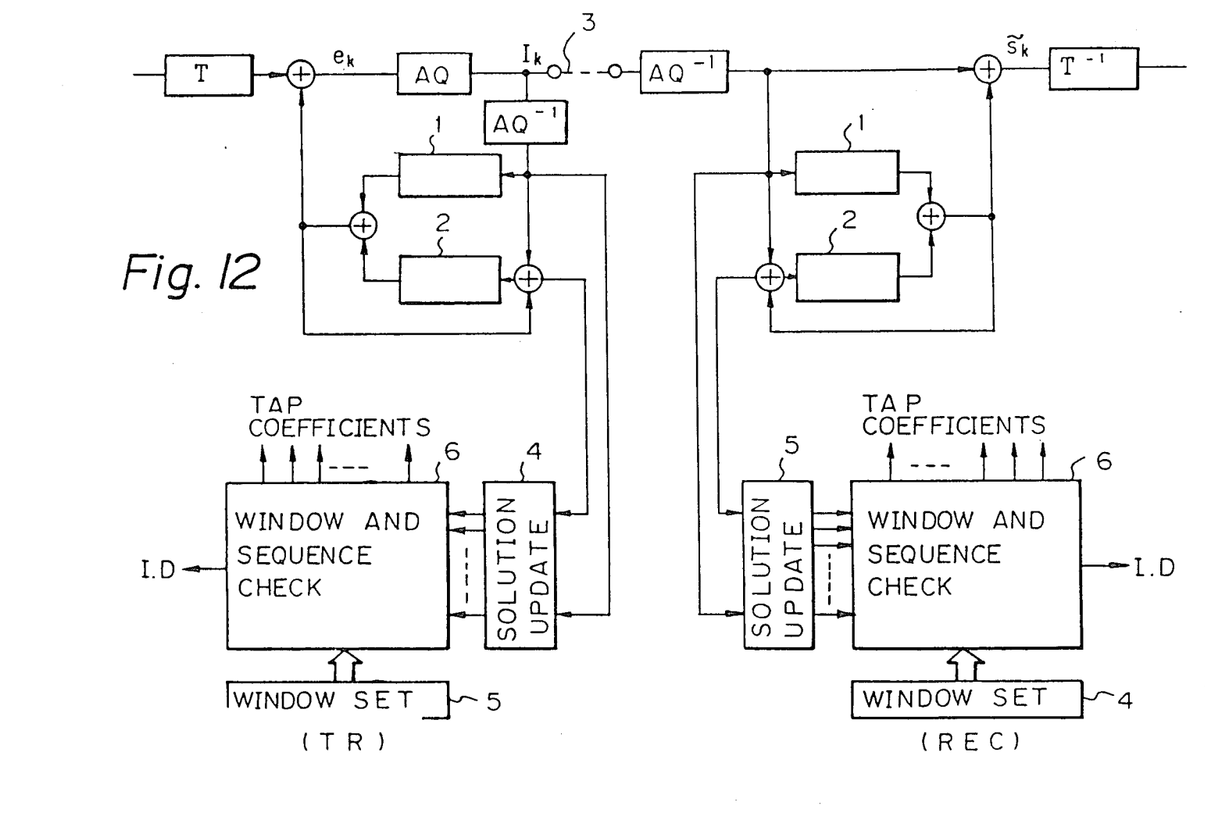
FIG. 12 is a block diagram of still another embodiment according to the present invention.

FIG. 12 shows a fifth embodiment of the present invention. In the figure, the symbol AQ is a quantizer, $AQ^{-1}$ is an inverse quantizer. The quantizer AQ provides the pulse code train $I_k$ from the difference signal $e_k$, and the inverse quantizer $AQ^{-1}$ functions to inverse said signals. In the embodiment, the code train $\underline{I}_k$ is transmitted to a line, and a reproduction signal $\overline{S}_k$ is obtained in the reception side. The symbol T in the figure shows an analog-digital conversion, or a digital-digital speed conversion, and $T^{-1}$ functions the reverse of T.

According to the embodiment of FIG. 12, the PCM signal which is the differential signal is received, and according to said process, the signal is discriminated correctly in a short time.

Figure 13:
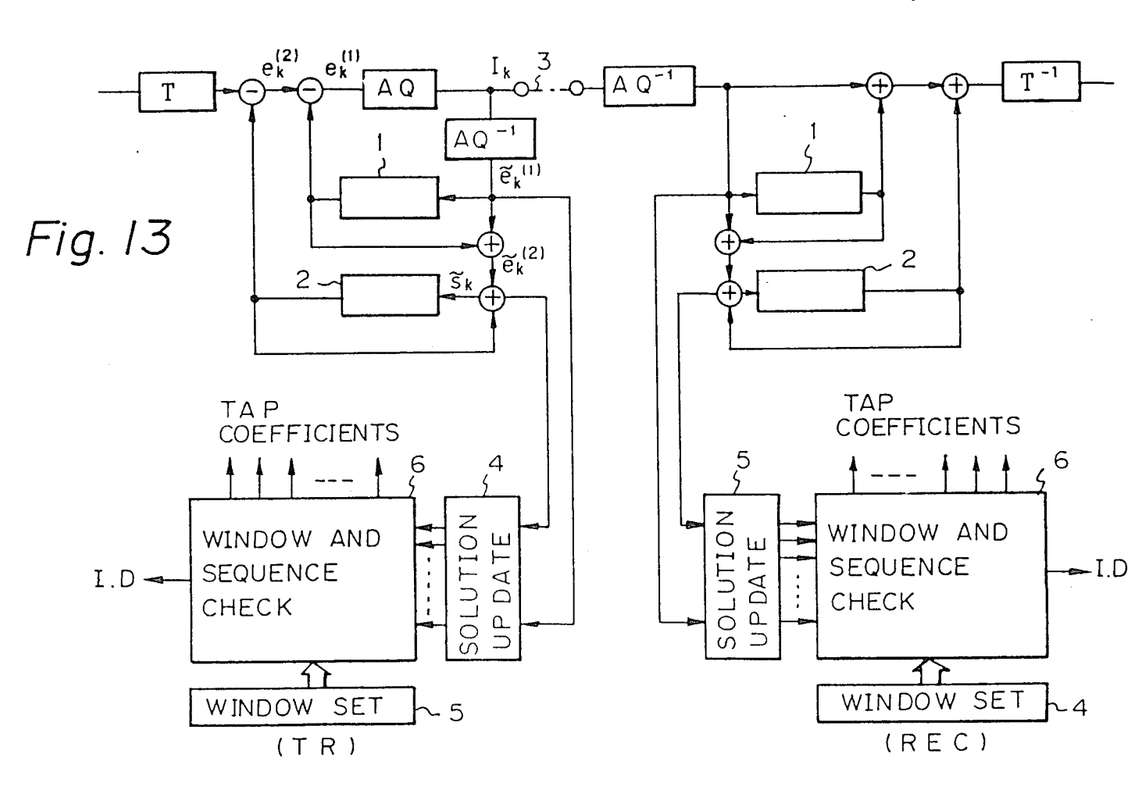
FIG. 13 is a block diagram of still another embodiment according to the present invention.

FIG. 13 is a block diagram of sixth embodiment of the present invention. The embodiment of FIG. 13 separates the error signal to the error signal $e_k^p$ by a pole filter, and another error signal $e_k^z$ by a zero point filter, while the previous embodiments use an error signal which is the difference between an input signal and the sum of a first prediction signal by a pole filter and a second prediction signal by a zero point filter, as an objective function for minimizing the error in an iterative control of an adaptive prediction filter. According to the embodiment of FIG. 13, the updated tap coefficient of a pole filter is obtained by the correlation value of $e_k^p$ and reproduced output signal $S_k$, and the updated value of the tap coefficients of a zero point filter is obtained by the correlation of $e_k^z$ themselves.

The structure of a pole filter and a zero point filter in FIG. 13 is the same as that of the embodiments of FIGS. 1 through 5, and the calculation process in FIG. 13 is shown below.

The control is accomplished according to the following equation at a discrete time k.

(a) a zero point filter;

$$w^{(1)}_{i,k+1} = (1 - \delta_i)w^{(1)}_{i,k} + g^{(1)}_k \widetilde{e^{(1)}_k} \sin w^{(1)}_{i,k} \sum_{j=1}^{m} A^{(1)}_{i,j} e^{(1)}_{k-j} \Biggr\} \quad (50)$$
$$v^{(1)}_{i,k+1} = (1 - \delta_i)v^{(1)}_{i,k} + g^{(1)}_k \widetilde{e^{(1)}_k} \sin v^{(1)}_{i,k} \sum_{j=1}^{m} B^{(1)}_{i,j} e^{(1)}_{k-j}$$

The tap coefficients are obtained by the following equations.

$$\left. \begin{array}{l} -2c^{(1)}_{i,k+1} = -2\cos w^{(1)}_{i,k+1} \\ -2d^{(1)}_{i,k+1} = -2\cos v^{(1)}_{i,k+1} \end{array} \right\} \quad (51)$$

where;

$$i = 1 \ldots n/2, \; g^{(1)}_k = \alpha / \sum_{i=1}^{m} (\widetilde{e^{(1)}_{k-i}})^2, \; \delta_i \text{ and } (\alpha) \text{ are constants} \quad (52)$$

the value ($\delta_i$) is usually in the range between $2^{-6}$ and $2^{-11}$, and the value ($\alpha$) is in the range between $2^{-7}$ and $2^{-10}$. The values $A_{i,j}^{(1)}$ and $B_{i,j}^{(1)}$ in the equation (50) are, when m=6, the same as those of equations of (41) through (46) in the fourth embodiment.

(b) a pole filter;

Similar to the case of a zero point filter;

$$w^{(2)}_{i,k+1} = (1 - \delta_i)w^{(2)}_{i,k} + g^{(2)}_k \widetilde{e^{(2)}_k} \sin w^{(2)}_{i,k} \sum_{j=1}^{n} A^{(2)}_{i,j} \widetilde{s}_{k-j} \Biggr\} \quad (53)$$
$$v^{(2)}_{i,k+1} = (1 - \delta_i)v^{(2)}_{i,k} + g^{(2)}_k \widetilde{e^{(2)}_k} \sin v^{(2)}_{i,k} \sum_{j=1}^{n} B^{(2)}_{i,j} \widetilde{s}_{k-j}$$

$$i = 1 \ldots n/2$$

The tape coefficients are;

$$\left. \begin{array}{l} -2c^{(2)}_{i,k+1} = -2\cos w^{(2)}_{i,k+1} \\ -2d^{(2)}_{i,k+1} = -2\cos v^{(2)}_{i,k+1} \end{array} \right\} \quad (54)$$

$$i = 1 \ldots n/2$$

where;

$$g^{(2)}_k = (\alpha)/ \sum_{i=1}^{n} (\widetilde{s}_{k-j})^2, \; \delta_i \text{ and } (\alpha) \text{ are constants.} \quad (55)$$

From the foregoing, it will now be apparent that a new and improved adaptive filter has been found. It should be inderstood of course that the embodiments disclosed are merely illustrative and are not intended to limit the scope of the invention. Reference should be made to the appended claims, therefore, rather than the specification as indicating the scope of the invention.

What is claimed is:

1. An adaptive digital filter with a transfer function which includes at least one of a pole and a zero point in a denominator and a numerator in a transfer function which changes successively or at least in every predetermined period, comprising:

an input terminal;

at least one of the denominator and the numerator of the transfer function in the complex Z plane being a Chebyshev polynomial;

said filter having a plurality of delay circuits connected to a series circuit with one end of said series circuit coupled to said input terminal, with tap coefficient elements coupled to junction points of said delay circuits, adders for providing the sum of outputs of said tap coefficient elements;

means coupled to said adders for monitoring the location of solutions of said Chebyshev polynomial on the complex Z plane and determining whether the solutions for zero points and the solutions for poles are located alternately on a unit circle in the complex Z plane and for updating solutions only when said zeros and said poles are located alternately on said unit circle to assure stable operation and minimum phase shift of the filter;

means for converting said updated solutions to updated tap coefficients only when said zeros and said poles are located alternately on said unit circle, and means coupled to said tap coefficient elements for adjusting said tap coefficient elements according to said updated tap coefficients only when said tap coefficients are updated.

* * * * *